United States Patent
Bromberger et al.

(10) Patent No.: US 6,933,215 B2
(45) Date of Patent: Aug. 23, 2005

(54) PROCESS FOR DOPING A SEMICONDUCTOR BODY

(75) Inventors: Christoph Bromberger, Leingarten (DE); Franz Dietz, Heilbronn (DE); Volker Dudek, Korntal-Muenchingen (DE); Michael Graf, Leonberg (DE); Joern Herrfurth, Heilbronn (DE); Manfred Klaussner, Heilbronn (DE)

(73) Assignee: Atmel Germany GmbH, Heilbronn (DE)

( * ) Notice: Subject to any disclaimer, the term of this patent is extended or adjusted under 35 U.S.C. 154(b) by 0 days.

(21) Appl. No.: 10/170,098

(22) Filed: Jun. 11, 2002

(65) Prior Publication Data

US 2003/0003643 A1 Jan. 2, 2003

(30) Foreign Application Priority Data

Jun. 29, 2001 (DE) .......................................... 101 31 704

(51) Int. Cl.⁷ ............................................ H01L 21/266
(52) U.S. Cl. ........................ 438/527; 438/433; 438/525
(58) Field of Search ................................ 438/433–434, 438/524–527, 529

(56) References Cited

U.S. PATENT DOCUMENTS

| | | | |
|---|---|---|---|
| 4,523,369 A | * 6/1985 | Nagakubo | 438/433 |
| H204 H | * 2/1987 | Oh et al. | 438/433 |
| 4,682,405 A | * 7/1987 | Blanchard et al. | 438/274 |
| 4,756,793 A | 7/1988 | Peek | 756/640 |
| 4,893,160 A | * 1/1990 | Blanchard | 257/334 |
| 4,975,384 A | 12/1990 | Baglee | |
| 5,338,965 A | 8/1994 | Malhi | 257/492 |
| 5,387,534 A | 2/1995 | Prall | |
| 5,406,111 A | * 4/1995 | Sun | 257/497 |
| 5,466,616 A | 11/1995 | Yang | |
| 5,482,873 A | * 1/1996 | Yang | 438/524 |
| 5,539,238 A | 7/1996 | Malhi | 257/510 |
| 5,569,949 A | 10/1996 | Malhi | 257/397 |
| 5,696,010 A | 12/1997 | Malhi | |
| 5,780,353 A | 7/1998 | Omid-Zohoor | |

(Continued)

FOREIGN PATENT DOCUMENTS

| | | |
|---|---|---|
| DE | 19733974 | 8/1998 |
| DE | 69316256 | 8/1998 |
| EP | 0176778 | 4/1986 |
| EP | 0209949 | 1/1987 |
| EP | 0232322 | 8/1987 |

(Continued)

OTHER PUBLICATIONS

"Process for Manufacturing a DMOS Transistor", by Christoph Bromberger et al.; U.S. Appl. No. 10/167,961, filed Jun. 11, 2002, pp. 1 to 14 and 2 sheets of drawings.

(Continued)

Primary Examiner—Anh Duy Mai
(74) Attorney, Agent, or Firm—W. F. Fasse; W. G. Fasse

(57) ABSTRACT

In a method of producing a doped semiconductor structure with a trench, it is possible to set the doping of the trench side walls independently from the doping of the trench bottom, and to set different doping concentrations of the individual trench side walls relative to each other. In the method, a mask layer with a window therein is provided on a surface of a semiconductor body, and then a first doping step, a trench etching step, and a second doping step are carried out successively through this window while this one mask layer remains in place on the surface of the semiconductor body. Further etching and doping steps can be carried out successively also through this window of the mask layer.

33 Claims, 2 Drawing Sheets

U.S. PATENT DOCUMENTS

| | | | |
|---|---|---|---|
| 5,846,866 A | 12/1998 | Huang et al. | 438/306 |
| 5,874,346 A | 2/1999 | Fulford, Jr. et al. | 438/433 |
| 5,902,127 A * | 5/1999 | Park | 438/435 |
| 5,915,195 A | 6/1999 | Fulford, Jr. et al. | 438/524 |
| 5,960,276 A | 9/1999 | Liaw et al. | 438/224 |
| 6,150,235 A | 11/2000 | Doong et al. | 438/424 |
| 6,184,566 B1 | 2/2001 | Gardner et al. | |
| 6,228,726 B1 | 5/2001 | Liaw | 438/294 |
| 6,613,651 B1 * | 9/2003 | Puchner et al. | 438/446 |
| 2003/0122188 A1 * | 7/2003 | Blanchard | 257/341 |

FOREIGN PATENT DOCUMENTS

| | | | |
|---|---|---|---|
| EP | 0547711 | 6/1993 | |
| EP | 0562271 | 9/1993 | |
| EP | 0837509 | 4/1998 | |
| EP | 0905784 | 3/1999 | |
| JP | 55130173 | 10/1980 | |
| JP | 56040280 | 4/1981 | |
| JP | 56050558 | 5/1981 | |
| JP | 56062365 | 5/1981 | |
| JP | 56085857 | 7/1981 | |
| JP | 58204569 | 11/1983 | |
| JP | 61-161732 * | 7/1986 | H01L/21/76 |
| JP | 03-082071 * | 4/1991 | H01L/27/04 |
| JP | 03-084925 * | 4/1991 | H01L/21/265 |
| JP | 2000-12842 | 1/2000 | |

OTHER PUBLICATIONS

"Process for Manufacturing a DMOS Transistor", by Christoph Bromberger et al.; U.S. Appl. No. 10/167,960; filed Jun. 11, 2002, pp. 1 to 14 and 2 sheets of drawings.

"Process for Manufacturing a DMOS Transistor", by Christoph Bromberger et al.; U.S. Appl. No. 10/167,959; filed Jun. 11, 2002, pp. 1 to 14 and 2 sheets of drawings.

* cited by examiner

PROCESS FOR DOPING A SEMICONDUCTOR BODY

BACKGROUND

1. Field of the Invention

The present invention relates to a process for doping and forming a trench in a semiconductor body.

2. Description of the Related Technology

Such a process is known from the printed U.S. Patent publication U.S. Pat. No. 5,466,616. Therein, the surface of a semiconductor body is doped through a mask window and, after an elevated temperature step, a trench structure is produced by an anisotropic dry etching process, whereby the dopant in the bottom region of the trench is removed by this etching step within the mask window. During the subsequent wet etching of a V trench, the laterally highly doped regions act as an etching stop, that is, they prevent any lateral etching below the window defined by the mask.

A further process for doping a semiconductor body is known from the printed publication EP 176 778. Here, by means of small additional windows in the margin regions of an implantation mask, with the size and number of such windows being dependent on the distance to the mask window proper, a doping profile is generated in the margin region of the mask, which doping profile features a laterally flat run and approaches gradually the surface of the semiconductor body in order to increase the breakthrough voltage of semiconductor elements. The disadvantage with this process is that the flat run zones produced require a significant amount of space, and this is an obstacle for a space-saving integration. Furthermore, comprehensive process and device simulations are necessary to calculate the exact number, position, and size of the windows in the doping agent masks.

Another aim with regard to the development in the area of semiconductor technology is to develop space-saving structures which feature low field strengths even for higher blocking voltages, in order to avoid the generation of charge carriers as such a generation causes a breakthrough within the silicon layer. A further aim is to decrease further the thermal budget in the manufacturing process of semiconductor structures by avoiding or shortening high temperature processes in order to produce flatter doping agent profiles within a semiconductor body.

SUMMARY OF THE INVENTION

The present invention is based on the task to state a process by means of which a semiconductor body can be doped such that low field strengths are achieved in a compact area and which can be carried out easily and at low cost.

In accordance with the above, the invention essentially consists in that a trench-shaped structure is etched in a semiconductor body, and that the side walls of the trench-shaped structure are doped independently from the bottom of the trench-shaped structure. To this end, in a first process step, a first doping agent is introduced in a semiconductor body by means of a doping agent mask. In a following second process step, a trench-shaped structure is produced in at least one region of the mask window by means of an anisotrope silicon etching step, and, in a third process step, a second doping agent is introduced.

In a further development of the process, if in a first process step a vertical introduction of the first doping agent has been effected, a diffusion step is carried out before the second process step, in order to avoid a complete removal of the first doping agent during the subsequent silicon etching, using a lateral diffusion below the mask edges. If, however, in the first process step the first doping agent is already laterally introduced under the mask edges, it is advantageous to carry out a diffusion or activation of the first doping agent remaining in the side walls of the trench-shaped structure after silicon etching with a later temperature step.

In another development of the process, it is advantageous to introduce in a third process step the second doping agent in selected locations, preferably in the bottom region of the trench-shaped structure. This can be carried out by covering one or several side walls of the trench-shaped structure with a protective layer, or by introducing the second doping agent in an anisotrope fashion.

An advantage of the process is that the bottom region of the trench-shaped structure can be doped independently from the side walls. Furthermore, different polarities and types of doping agents can be introduced into the various individual side walls of the trench-shaped structure, by covering one or several side walls with a protective layer, for example by means of a molecular radiation emission plant, before the respective doping agent is introduced. Inasmuch as no protective layers are generated, the spatially selective introduction of the second doping agent in the third process step can be used to set independently the concentration and polarity of the doping in the individual side walls. In particular, different vertical concentration gradients from the individual side walls to the bottom region of the trench-shaped structure can be set up. Furthermore, when doping the individual side walls and the bottom region of the trench-shaped structure, the polarity of the doping agents can be changed. Furthermore, it is advantageous to adapt the doping agent profile of the trench-shaped structure to the electrical requirements of an integrated circuit, e.g. at high blocking voltages in order to achieve low field strengths for a minimum space requirement through the vertical derivation of the field gradient, and thus to increase the integration density in the manufacture of integrated circuits. In particular, for applications in the blocking voltage area, it is advantageous to fill up the trench-shaped structure by means of an insulating material such as oxide and/or nitride for example.

In a further development of the process, the bottom region of the trench-shaped structure is doped selectively, in spite of the isotrope introduction of the second doping agent, by covering all side walls with a protective layer before the third process step, preferably using an oxide and/or nitride. In addition, by covering all side walls by means of a separation or oxidation process for example, process control can be simplified, with the thickness of the protective layer being determined from the range/diffusion length of the doping agent in the protective layer.

In another development of the process it is advantageous to generate the protective layer on the side walls with self-adjustment, for example by means of a spacer process. In a spacer process, the starting layer such as a nitride and/or oxide layer, for example, is generated by a deposition. Thus, it is possible to cover especially non-vertical side walls with a sufficiently thick protective layer, without exposing the wafer to a high temperature load. Moreover, it is easy to set the required minimum thickness of the protective layer by means of the process parameters occurring during the layer deposition, such as for example conformity and layer thickness, in combination with the etching parameters such as the selectivity of oxide to silicon and etching duration.

Furthermore, using the protective layer as a mask, another silicon etching step can be carried out.

In another development of the process, a first and second doping agent are introduced by means of an implantation, with the introduction being preferably implemented at an implantation angle which is vertical relative to the surface of the semiconductor body. Inasmuch as the side walls of the trench-shaped structure are vertical, this can be used to carry out a selective doping of the bottom region without the side walls being covered with a protective layer. In order to increase process safety during implantation, it is however meaningful and possible to use also the thin scattering oxide—of 100 A, for example,—as a protective layer for the side walls, formed before an implantation in the bottom region for suppression of a possible cross-contamination in order to obstruct the introduction of doping agent at the side walls, for example in the event of a possible incorrect adjustment of the wafer.

In another development of the process, a doping agent featuring the same polarity but different concentrations is implanted in the first and third process steps, in order to generate a vertical doping agent gradient in the side wall, with it being advantageous here to select the concentration of the doping agent such that it is lower in the first process step than in the third process step. If furthermore, in particular in the third process step, the implantation is carried out at two angles, with one implantation angle being preferably vertical, it is possible to generate a concentration gradient in a simple fashion between the individual side walls.

In a further development of the process, in the first process step the polarity of the doping agent is changed in comparison with the third process step in order to produce one or several PN junctions either between the side walls and the bottom region of the structure or between the individual side walls.

In a further development of the process, it is particularly advantageous, if the ratio from trench width to trench depth is greater than 0.5 as this allows the production of the trench-shaped structure to be implemented with standard processes such as a "shallow trench isolation" process (STI). It is also advantageous to carry out before the third process step (implantation) an anisotrope silicon etching step, using the protective layer as an etching mask. In this way, it is particularly easy to increase the depth of the trench structure before the third process step (the second implantation) and to produce a region in the trench-shaped structure between the first and second doping, as the concentration of the doping agents introduced does not sum up.

In a further development of the process, one or several of the process steps 1 to 3 are carried out repeatedly after the third process step in order to produce, for example, multiple PN junctions such as NPN or PNP or thyristor structures in the trench-shaped structure.

Trench-shaped structures which are filled with oxide, for example, can be advantageously integrated into components in order to reduce, for example, the field strength peaks occurring at high voltages in compact areas by means of the freely selectable side wall and bottom profiles. Furthermore, the insulation between adjacent semiconductor components can be improved, with only a compact area being used. A further application consists, for example in the case of wafers with an insulating intermediate layer, in that a buried resistance structure can be produced by means of the vertical doping profile on the side wall in combination with the doping of the bottom region and the residual thickness between the insulating layer and the bottom of the trench-shaped structure.

BRIEF DESCRIPTION OF THE FIGURES

In the following, the process according to the invention is to be explained in more detail by means of schematic embodiment examples and in connection with the drawings. The figures below show:

FIG. 1a a cross-section of a trench-shaped structure with vertical side walls, and FIG. 1b a further development of the trench-shaped structure in FIG. 1a with a vertical doping profile in the side walls, and FIG. 2a a cross-section of a trench-shaped structure with a doping agent concentration that is different, respectively, in the left-hand and right-hand side walls, and FIG. 2b a further development of the trench-shaped structure in FIG. 2a with side walls where each features a varying inclination, and FIG. 3 an alternative of FIG. 2a.

DESCRIPTION OF THE PREFERRED EMBODIMENTS

Figure 1A:
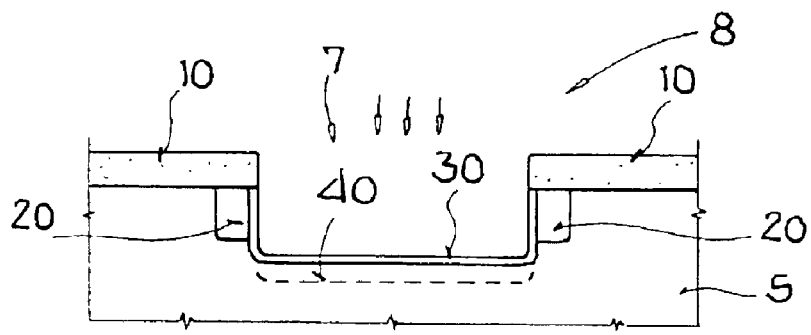

FIG. 1a shows a cross-section of a semiconductor body 5 made of silicon, hereinafter designated as wafer 5, which features a trench-shaped structure. Such an arrangement can be used e.g. for the insulation of adjacent components on the wafer.

In the following the figure is explained in more detail, with the structuring of the wafer being implemented by a process sequence not shown here. The wafer features a lower doping, which is approx. 20 ohm/cm for example, of a first polarity. The starting point for the structuring is provided by a protective layer 10, which consists of an oxide/nitride layer for example, in which a window 7 is produced by means of a mask step. In a subsequent process step, a doping agent of a second polarity is implanted by means of an implantation and diffused in by means of a thermal process. In a following process step, a trench-shaped structure 8 is produced in the window 7 by means of an anisotrope silicon etching, with the depth of the etching exceeding the penetration depth of the doping. Due to the lateral diffusion below in combination with the silicon etching, there remains a first and a second region 20 in the left-hand and right-hand side walls, which regions contain some part of the doping agent of the first polarity.

Another advantageous possibility to produce the doped regions 20 consists in that the doping agent is introduced laterally underneath the mask edges by means of an implantation with different angles, up to 60 degrees for example. This causes a sufficient amount of doping agent to remain in the side walls of the trench-shaped structure 8 after the silicon etching step, even without the diffusion step.

In a subsequent process step, the side walls and bottom region are lined with a layer 30 which, for example, consists of a thermally produced oxide and is in the region of 100 Å. Whilst, in the following implantation step shown in the figure, the oxide on the side walls is used as a protective layer, it acts as a scattering oxide in the bottom region and prevents a cross-contamination of the bottom region of the trench-shaped structure 8. In the implantation step, a doping agent of a second polarity with a concentration, which is lower than the concentration of the first doping agent introduced, is implanted in a region 40. As the implantation is effected in a position vertical to the wafer surface, only the bottom region is doped.

Figure 1B:
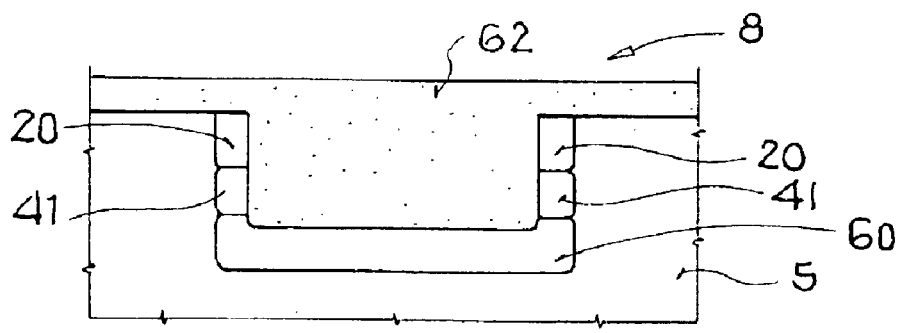

The cross-sectional view of FIG. 1b shows a further development of the trench-shaped structure 8 shown in FIG. 1a, with the further process steps, that are carried out for producing the structure shown, being described below. In a diffusion step, the doping agent of the region 40 is diffused laterally into a region 41 as well as into the bottom region, with the doping agent in the bottom region being removed completely by a subsequent anisotrope silicon etching; in the left-hand and right-hand side walls, therefore, the doping agent introduced remains exclusively in the regions 41. In a subsequent process step, a scattering oxide is produced which acts as a protective layer on the side walls. In a subsequent process step, a further doping agent of the second polarity is introduced at a vertical angle by means of an implantation, with the concentration being lower than the concentration of the second implantation step. In a subsequent diffusion step, the doping agent is diffused into a region 60. In a further subsequent process step, the structure is filled up with an oxide 62.

Due to the multiple application of the process sequence that consists of etching and implantation, a vertical doping profile is provided in the side wall of the trench-shaped structure 8, which features a decreasing level of concentration towards the bottom of the trench-shaped structure. Due to the independent selection of the doping agent between the bottom region and the side walls, that is polarity and concentration of the doping agent in the side walls, it is also possible to provide opposite concentration gradients, that is, the bottom region features a higher concentration than the side walls. By means of the process parameters, such as for example etching depth, dosage, and energy, smooth concentration transitions can be generated without any high temperature loads. In the case of an applied blocking voltage, field strength peaks can be avoided in this way. Furthermore, by changing the polarity of the doping agent between the individual implantation steps, multiple PN junctions can be produced such as, for example, PNP, NPN, or thyristor structures. Inasmuch as in the individual implantation steps implantation is vertical and no scattering oxide is required in the bottom region, the thin protective oxide layer on the side walls is not needed, that is, the thermal load of the wafer can be reduced even further.

Figure 2A:
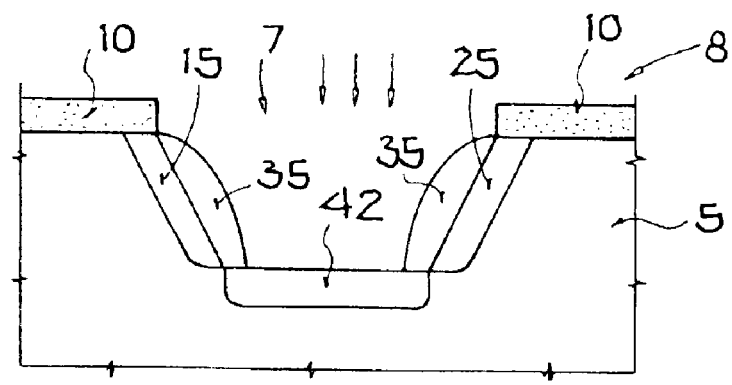

The cross-sectional view shown in FIG. 2a shows a wafer with a trench-shaped structure 8—as produced with an STI etching, for example. Here, due to the increasing polymerization of the side wall during the dry etching of the silicon, the window of the structure can be reduced continuously as the etching depth increases. The aspect ratio of the trench-shaped structure 8 is preferably above 0.5.

Figure 2B:
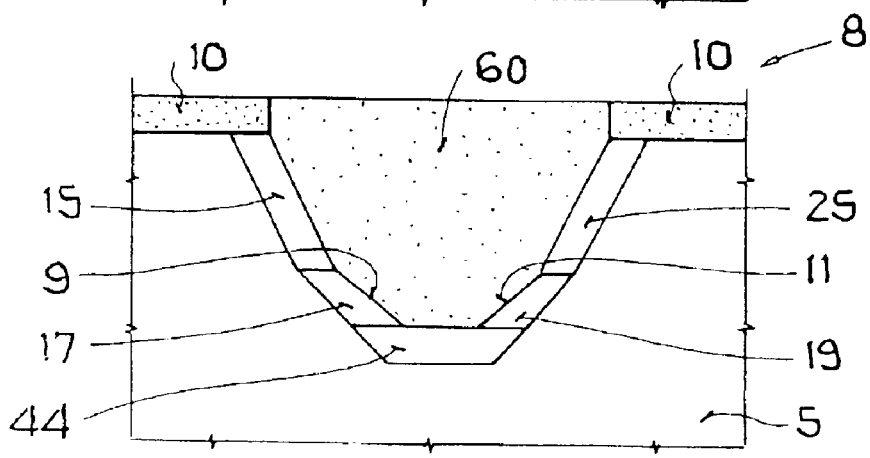
Figure 3:
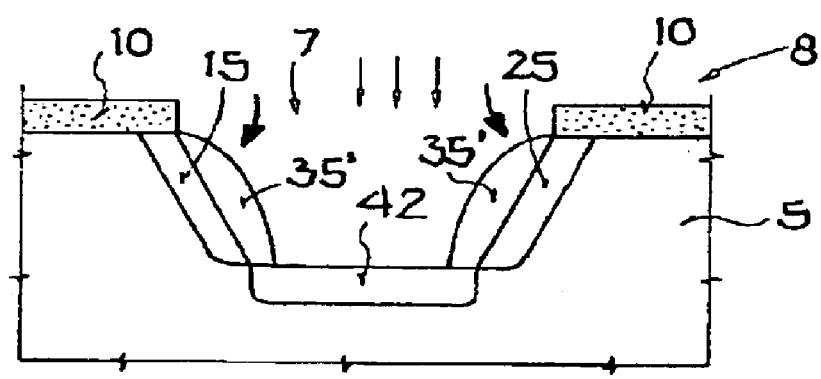

In the following, FIGS. 2a, 2b and 3 are explained in more detail, with the structuring of the wafer being implemented by a process sequence not shown here. The wafer features a lower doping of a first polarity, whose specific resistance is approx. 20 ohm/cm for example. The starting point for the structuring is provided by a protective layer 10 in which a window 7 is produced by means of a mask step. In a subsequent process step, a doping agent of a second polarity is implanted by means of an implantation at an angle (tilt), of 45 degrees for example, and diffused in by means of a thermal process, with the tilt angle being selected such that the implantation is effected from left to right. In a following process step, a trench-shaped structure 8 with inclined side walls is produced in the window 7 by means of an anisotrope silicon etching, with the depth of the etching exceeding the penetration depth of the doping. After etching, due to the lateral diffusion below, in the left-hand side wall in a region 15 as well as in the right-hand side wall in a region 25, there remains some part of the doping agent implanted. Due to the implantation at a tilt angle, the region 25 in the right-hand side wall features a significantly higher doping agent concentration than the region 15 in the left-hand side wall. In a subsequent process step, the side walls are protected against the introduction of a further doping agent by means of a spacer process which generates a protective oxide layer 35 as shown in FIG. 2a or by depositing a protective oxide layer 35' on the side walls as shown in FIG. 3. In a subsequent process step, a doping agent of the second polarity is introduced into the bottom region of the trench-shaped structure by means of a second implantation step, with the doping agent diffusing into a region 42 in a subsequent diffusion step.

The cross-sectional view of FIG. 2b shows a further development of the trench-shaped structure 8 shown in FIG. 2a, as it can be used for example between two adjacent components, or within a component, for high voltages such as a HVMOS transistor. The further process steps are described below. After the doping agent has diffused into the region 42, an anisotrope silicon etching is carried out in a subsequent process step by means of the protective layer 35, where the depth of the etching is greater than the penetration depth of the doping agent. Due to a limited selectivity of the etching rate from silicon to oxide, the side walls in the bottom region are slowly moved back during silicon etching, resulting in a side wall area 9 and a side wall area 11. In a following process step, the remaining protective oxide is removed from the side wall, and the trench-shaped structure 8 is implanted with a doping agent of a second polarity in the bottom region as well as in the left-hand side wall by means of a subsequent implantation step, at a tilt angle of approx. 30 degrees, with the dosage being higher than the dosage of the second implantation. In a subsequent diffusion step, the doping agent is diffused into a region 44 in the bottom region. Furthermore, during the temperature process, even doping agents from the region 44 and the regions 15 or 25 diffuse into a region 17 or 19, with the doping agent concentration in the regions 17 or 19 having to lie between the concentrations in the regions 15 and 44, or 25 and 44. In a subsequent process step, the trench-shaped structure 8 is filled up by means of an oxide 60.

Due to the possibility, even with inclined side walls, to set the doping agent introduction into the side walls independently of the bottom region by means of protective layers, and in combination with the possibility also to dope the respective side walls in different strengths, the doping agent concentration can be increased continuously starting from one side of the trench-shaped structure. This can be used, for example when applying a blocking voltage to the trench-shaped structure 8, to reduce the required wafer surface by derivation of the field gradient into a vertical direction as opposed to an exclusively lateral forming of the field gradient. By varying the width and depth of the trench-shaped structure, the structure can be adapted easily to the electrical requirements. Furthermore, the process can also be transferred to wafers with an insulating intermediate layer by producing the trench-shaped structure 8 in the upper active silicon layer, with the doping and the cross-sectional surface area of the silicon layer remaining under the trench-shaped structure 8 determining its current carrying capacity.

What is claimed is:
1. A method of producing a doped semiconductor active device structure, comprising the steps:
   a) providing a semiconductor body including an active device region that is to have said active device structure formed therein;

b) providing a mask layer with a mask window as an opening having an opening size therein on a surface of said semiconductor body;

c) introducing a first dopant into said active device region of said semiconductor body through all of said opening size of said mask window of said mask layer;

d) after said step c), leaving said mask layer in place on said surface of said semiconductor body, and carrying out anisotropic etching of said semiconductor body through all of said opening size of said mask window of said mask layer so as to etch a trench from said surface into said active device region of said semiconductor body while leaving at least one first doped region containing said first dopant along at least one of two sidewalls of said trench, wherein said first doped region is located at least partly laterally offset from said mask window under said mask layer;

e) after said step d), leaving said mask layer in place on said surface of said semiconductor body, and introducing a second dopant into said active device region of said semiconductor body through all of said opening size of said mask window of said mask layer so as to form a second doped region containing said second dopant at a bottom of said trench; and f) performing further fabrication to complete said active device structure including said trench and said doped regions in said active device region of said semiconductor body.

2. The method according to claim 1, wherein said introducing of said first dopant in said step c) comprises an implantation of said first dopant into said semiconductor body along an implantation direction perpendicular to said surface, followed by a thermal diffusion of said first dopant laterally into said first doped region which is located laterally offset from said mask window under said mask layer.

3. The method according to claim 1, wherein said introducing of said first dopant in said step c) comprises an implantation of said first dopant into said semiconductor body along an implantation direction at an oblique angle relative to said surface so as to implant said first dopant into said first doped region which is located laterally offset from said mask window under said mask layer.

4. The method according to claim 1, wherein said introducing of said second dopant in said step e) is carried out with spatial selectivity, or further comprising providing a protective layer to cover a first one of said sidewalls differentially relative to a second one of said sidewalls prior to said introducing of said second dopant in said step e), so as to form said second doped region with a laterally varying concentration gradient of said second dopant.

5. The method according to claim 1, further comprising, between said steps d) and e), carrying out thermal oxidation to form in place an oxide protective layer on said two sidewalls and on said bottom of said trench, and performing said introducing of said second dopant in said step e) through said oxide protective layer on said bottom.

6. The method according to claim 1, wherein no protective layer is formed on said sidewalls of said trench, and said first doped region remains exposed to said trench directly at said one of said two sidewalls.

7. The method according to claim 1, wherein said mask layer is an insulating layer of at least one of an oxide and a nitride.

8. The method according to claim 1, wherein said steps are carried out so that said two sidewalls of said trench are each smoothly continuous without having any step transition in one or both of said sidewalls.

9. The method according to claim 1, wherein said sidewalls each respectively extend at an oblique slope angle to provide a tapering cross-sectional configuration of said trench.

10. The method according to claim 1, wherein each of said sidewalls has at learnt two consecutive sidewall portions respectively extending at different angular values of an oblique slope angle to provide a progressively tapering cross-sectional configuration of said trench.

11. The method according to claim 1, wherein said sidewalls each respectively extend perpendicularly to said surface of said semiconductor body to provide a uniform non-varying rectangular cross-sectional configuration of said trench.

12. The method according to claim 11, wherein a cross-sectional area of said etching in said step d) determined by said opening size of said mask window equals a cross-sectional area of said introducing of said second dopant in said step e) that is also determined by said opening size of said mask window.

13. The method according to claim 1, further comprising, after said step e), a step of filling said trench with an insulator.

14. The method according to claim 1, wherein said introducing of said first dopant in said step c) is the only dopant introduction carried out at a location of and adjacent to said trench before said etching to form said trench in said step d), so that said etching in said step d) etches said trench through and along only said at least one first doped region and no additional doped region in said semiconductor body.

15. The method according to claim 1, wherein said first dopant and said second dopant both have the same polarity, and said introducing of said first dopant and said introducing of said second dopant respectively comprise dopant implantations carried out so that said first dopant and said second dopant are respectively implanted with different dosages.

16. The method according to claim 15, wherein an implantation dosage of said second dopant is higher than an implantation dosage of said first dopant.

17. The method according to claim 1, wherein said first dopant and said second dopant respectively have different polarities relative to each other.

18. The method according to claim 1, wherein a dopant concentration of said second dopant in said second doped region is lower than a dopant concentration of maid first dopant in said first doped region.

19. The method according to claim 1, wherein two of said first doped regions containing said first dopant are formed respectively along said two sidewalls, and said two first doped regions respectively have different dopant concentrations of said first dopant.

20. The method according to claim 1, wherein said trench, when finished, has a trench width and a trench depth with a ratio of said trench width relative to said trench depth being greater than 0.5.

21. The method according to claim 1, further comprising, after said step e), the following additional steps:

f) after said step c), leaving said mask layer in place on said surface of said semiconductor body, and carrying out anisotropic etching of said semiconductor body through maid mask window of said mask layer so as to etch said trench deeper into said semiconductor body to a new floor of said trench; and g) after said step f), leaving said mask layer in place on said surface of said semiconductor body, and introducing a third dopant into maid semiconductor body through said mask window of said mask layer so as to form a third doped region containing said third dopant at maid new floor of said trench.

22. The method according to claim 21, wherein said first doped region, said second doped region and maid third doped region extend continuously in succession front said mask layer along maid at least one of said sidewalls to said new floor and along maid new floor of said trench.

23. The method according to claim 22, wherein said first doped region and said second doped region form a first pn-junction at an interface therebetween, and said second doped region and said third doped region form a second pn-junction at an interface therebetween.

24. The method according to claim 21, wherein a dopant concentration of said third dopant in said third doped region is lower than a dopant concentration of said second dopant in said second doped region.

25. The method according to claim 21, wherein said introducing of said second dopant in said step a) comprises an implantation of said second dopant, followed by a thermal diffusion of said second dopant laterally into and throughout said second doped region.

26. The method according to claim 21, wherein said introducing of said third dopant in said step g) comprises an implantation of said third dopant, followed by a thermal diffusion of said third dopant throughout said third doped region.

27. The method according to claim 26, further comprising diffusing said first dopant from said first doped region into said second doped region, and diffusing said third dopant from said third doped region into said second doped region, during said thermal diffusion of said third dopant throughout said third doped region.

28. The method according to claim 21, further comprising depositing a protective oxide layer on said sidewalls of said trench between said steps d) and e).

29. The method according to claim 5, wherein said oxide protective layer has a thickness in a region of 100 Å.

30. The method according to claim 1, wherein upon completion of said method, no undoped region remains along either of said sidewalls or said bottom of said trench.

31. The method according to claim 1, wherein said trench, when finished, has a maximum trench width greater than a maximum trench depth thereof.

32. A method of producing a doped semiconductor active device structure, comprising the steps:
  a) providing a semiconductor body including an active device region that is to have said active device structure formed therein;
  b) providing a mask layer with a mask window as an opening therein on a surface of said semiconductor body;
  c) introducing a first dopant into said active device region of said semiconductor body through said mask window of said mask layer;
  d) after said step c), leaving said mask layer in place on said surface of said semiconductor body, and carrying out anisotropic etching of said semiconductor body through said mask window of said mask layer so as to etch a trench from said surface into said active device region of said semiconductor body while leaving at least one first doped region containing said first dopant along at least one of two sidewalls of said trench;
  e) after said step d), leaving said mask layer in place on said surface of said semiconductor body, and introducing a second dopant into said active device region of said semiconductor body through said mask window of said mask layer so as to form a second doped region containing said second dopant at a bottom of said trench, wherein said introducing of said second dopant in said step e) is carried out with spatial selectivity, or further comprising providing a protective layer to cover a first one of said sidewalls differentially relative to a second one of said sidewalls prior to said introducing of said second dopant in said step e), so as to form said second doped region with a laterally varying concentration gradient of said second dopant; and
  f) performing further fabrication to complete said active device structure including said trench and said doped regions in said active device region of said semiconductor body.

33. A method of producing a doped semiconductor device structure, comprising the steps:
  a) providing a semiconductor body;
  b) providing a mask layer with a mask window as an opening therein on a surface of said semiconductor body;
  c) introducing a first dopant into said semiconductor body through said mask window of said mask layer;
  d) after said step c), leaving said mask layer in place on said surface of said semiconductor body, and carrying out anisotropic etching of said semiconductor body through said mask window of said mask layer so as to etch a trench from said surface into said semiconductor body while leaving at least one first doped region containing said first dopant along at least one of two sidewalls of said trench;
  e) after said step d), leaving said mask layer in place on said surf ace of said semiconductor body, and introducing a second dopant into said semiconductor body through said mask window of said mask layer so as to form a second doped region containing said second dopant at a bottom of said trench;
  f) after said step e), leaving said mask layer in place on said surface of said semiconductor body, and carrying out anisotropic etching of said semiconductor body through said mask window of said mask layer so as to etch said trench deeper into said semiconductor body to a new floor of said trench; and
  g) after said step f), leaving said mask layer in place on said surface of said semiconductor body, and introducing a third dopant into said semiconductor body through said mask window of said mask layer so as to form a third doped region containing said third dopant at said new floor of said trench;
  wherein said first doped region, said second doped region and said third doped region extend continuously in succession from said mask layer along said at least one of said sidewalls to said new floor and along said new floor of said trench; and
  wherein said first doped region and said second doped region form a first pn-junction at an interface therebetween, and said second doped region and said third doped region form a second pn-junction at an interface therebetween.

* * * * *

UNITED STATES PATENT AND TRADEMARK OFFICE
CERTIFICATE OF CORRECTION

PATENT NO. : 6,933,215 B2
DATED : August 23, 2005
INVENTOR(S) : Bromberger et al.

It is certified that error appears in the above-identified patent and that said Letters Patent is hereby corrected as shown below:

Column 8,
Line 6, after "has at", replace "learnt" by -- least --;
Lines 45, 61 and 66, replace "maid" by -- said --;
Line 58, after "step", replace "c)," by -- e), --;

Column 9,
Lines 2, 4, 6 and 7, replace "maid" by -- said --;
Line 5, after "succession", replace "front" by -- from --;
Line 18, after "step", replace "a)" by -- e) --;

Column 10,
Line 36, replace "surf ace" by -- surface --.

Signed and Sealed this

Twenty-seventh Day of December, 2005

JON W. DUDAS
*Director of the United States Patent and Trademark Office*